(12) United States Patent  
Stergiou et al.

(10) Patent No.: US 8,595,659 B2
(45) Date of Patent: Nov. 26, 2013

(54) VERIFICATION AND REACHABILITY USING AN ORGANIC APPROACH

(75) Inventors: Stergios Stergiou, Sunnyvale, CA (US); Jawahar Jain, Sunnyvale, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/924,291

(22) Filed: Oct. 25, 2007

(65) Prior Publication Data

US 2008/0109202 A1 May 8, 2008

Related U.S. Application Data

(60) Provisional application No. 60/855,411, filed on Oct. 31, 2006.

(51) Int. Cl.
*G06F 17/50* (2006.01)

(52) U.S. Cl.
USPC ........................................................ 716/104

(58) Field of Classification Search
USPC .......................................... 716/1, 5, 100, 104
See application file for complete search history.

(56) References Cited

U.S. PATENT DOCUMENTS

| | | | |
|---|---|---|---|
| 7,546,563 B2* | 6/2009 | Jain et al. | 716/106 |
| 8,181,132 B2* | 5/2012 | Jain et al. | 716/104 |
| 2004/0093571 A1 | 5/2004 | Jain et al. | |
| 2004/0098682 A1 | 5/2004 | Jain | |
| 2005/0138474 A1* | 6/2005 | Jain et al. | 714/30 |
| 2007/0124711 A1 | 5/2007 | Jain et al. | |
| 2008/0072190 A1* | 3/2008 | Jain et al. | 716/5 |
| 2008/0109202 A1* | 5/2008 | Stergiou et al. | 703/13 |
| 2009/0210212 A1* | 8/2009 | Jain et al. | 703/14 |

FOREIGN PATENT DOCUMENTS

| | | |
|---|---|---|
| JP | 2005-158073 | 6/2005 |
| JP | 2005-182766 | 7/2005 |

OTHER PUBLICATIONS

European Search Report dated Mar. 25, 2008 for corresponding European Application No. 07021246.9-2224.
Sahoo D et al., "Multi-threaded Reachability", Jun. 13, 2005, pp. 467-470.
European Communication dated Oct. 24, 2008 in corresponding European Patent Application No. 07021246.9-2224/1939773.
Sahoo et al., "Multi-threaded Reachability" Jun. 13, 2005, pp. 467-470.
Sole et al., "Evaluating Symbolic Traversal Algorithms Applied to Asynchronous Concurrent Systems", 2004, pp. 207-216.
Cabodi et al., "Reachability analysis of large circuits using disjunctive partitioning and partial iterative squaring", Feb. 1, 2001, pp. 163-166 and 171-172.
Japanese Office Action dated Feb. 24, 2011 issued in corresponding Japanese Patent Application No. 2007-282426.
European Office Action dated Apr. 30, 2013 issued in corresponding European Patent Application No. 07 021 246.9-1960.

* cited by examiner

*Primary Examiner* — Suchin Parihar
(74) *Attorney, Agent, or Firm* — Staas & Halsey LLP (57) ABSTRACT

A system and method for running multiple image computation approaches in parallel and selecting an optimal one of the image computation approaches for verification use based on efficiency of individual approaches. The method automatically determines an optimal approach with respect to modifications of parameters that can affect efficiency of the verification.

20 Claims, 4 Drawing Sheets

VERIFICATION AND REACHABILITY USING AN ORGANIC APPROACH

CROSS-REFERENCE TO RELATED APPLICATION

This application is related to and claims priority to U.S. Application Ser. No. 60/855,411, entitled VERIFICATION USING AN ORGANIC APPROACH, inventor Jawahar Jain, et al., filed on Oct. 31, 2006, in the United States Patent and Trademark Office, the disclosures of both of which are incorporated herein by reference.

BACKGROUND

1. Field

The embodiments discussed herein are directed to verification, and more particularly, verification and reachability analysis of hardware or software design using an organic approach.

2. Description of the Related Art

As development of complex hardware and software design increases, limitations of existing verification techniques are becoming more evident. Verification generally deals with checking whether a software and/or hardware design satisfies an expected requirement with respect to a particular specification or property. A common approach to verification is checking properties of the design. One such approach is unbounded model checking of invariant properties of a system, which is generally performed by conducting a reachability analysis. This approach is directed to finding all states reachable from an initial state and checking whether the invariant properties are satisfied in the reachable states. Reachability analysis is typically performed using transition relation based image computation. However, the unbounded model checking and other similar approaches experience the so-called state explosion problem, especially in representing large designs, because sizes of representations dealing with reached states become exponentially large. Moreover, due to the sizes of the representations, a large memory space is required to store the representations.

In addition to requiring use of a large memory space, typical techniques for computing valid state sets require all reachable states to be computed because full error detection coverage is required. Since all image computation sub-operations need to be completed before new states are extracted, these techniques do not enable analysis or verification during a single image computation. That is, each conjunction can only be performed after a preceding one is completed. Thus, there is no mechanism of extracting new states until all image computation is complete.

Typically, valid state sets are computed by performing extensive circuit simulations, since a property can be invalidated if an invalid state is detected during simulation. However, validating a property through simulation is not possible, since the set of valid states is typically too large to explicitly enumerate. Although typical digital circuit verification has been performed by extensive simulations, their performance is unsatisfactory because simulations do not provide full coverage and only check a small portion of possible stimulus, leaving bugs/problems undetected.

Generally, verification involves running one image computation method until all image computations are complete, checking results thereof, and if unsatisfied by the results, running a different method. These techniques do not provide an intelligent way of determining an optimal solution without having to expend resources for computation of all reachable states and analyzing results of the individual techniques. It is also impossible to specify a method that should be applied at a particular stage of verification since typical verification techniques are restricted to a particular method until completion of all image computations.

Although various verification techniques have been proposed, existing verification techniques do not provide a way of identifying an optimal solution to efficiently perform verification. Since the difference between a suboptimal method and one which is better suited can be in orders of magnitude or more, there is a need for a verification system and method that provides an optimal verification solution.

SUMMARY

The embodiments discussed herein provide a method and system running multiple image computation approaches in parallel, and selecting one of the image computation approaches for use based efficiency of individual approaches.

The disclosed method includes obtaining reachable states of a system under verification by selecting one of image computation approaches running concurrently, and verifying properties of the system by analyzing reachable states with respect to a target specification of the system. An image computation approach may be selected at any point.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE EMBODIMENTS

Reference will now be made in detail to the present embodiments discussed herein, examples of which are illustrated in the accompanying drawings, wherein like reference numerals refer to the like elements throughout. The embodiments are described below to explain the disclosed system and method by referring to the figures. It will nevertheless be understood that no limitation of the scope is thereby intended, such alterations and further modifications in the illustrated device, and such further applications of the principles as illustrated therein being contemplated as would normally occur to one skilled in the art to which the embodiments relate.

The embodiments have been described with respect to an organic approach for verification of hardware and software designs. The disclosed approach may be used to verify a program, software, one or more hardware components or an apparatus with multiple components in entirety. Reachability analysis refers to both forward reachability where image computation is implemented to initial states of a program or machine until a fixed point is reached, and backward reachability where image computation is applied to the complement of state sets obtained from properties, until invalidating states thereof are obtained.

Figure 1:
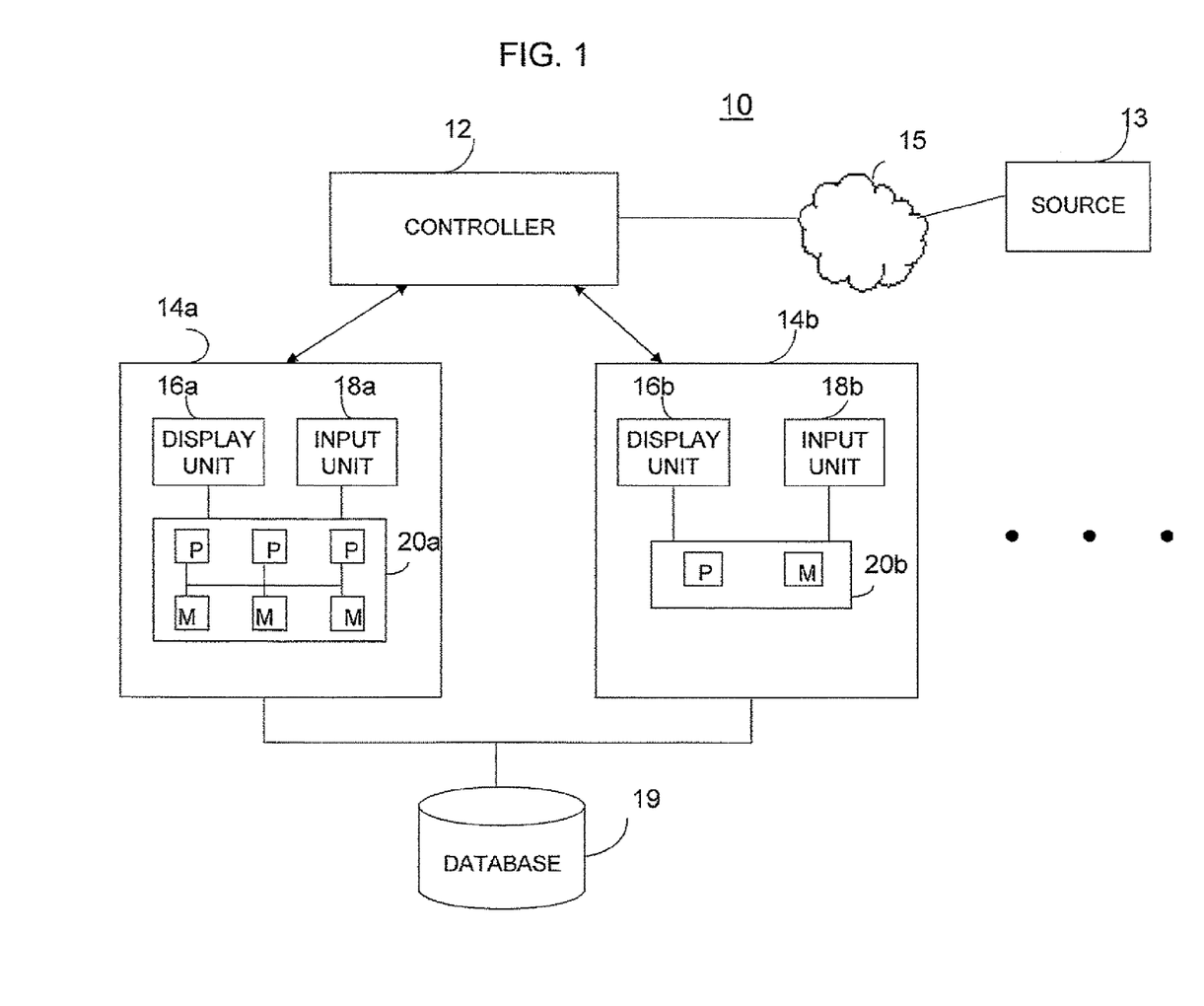
FIG. 1 is a block diagram of a system configured to perform an organic verification approach.

FIG. 1 illustrates a system for conducting an organic verification approach. As shown in FIG. 1, the system 10 includes a controller 12 connected to verifiers 14a and 14b. The controller 12 manages hardware or software verification implemented using verifiers 14 and may provide design information pertaining to the hardware or the software under verification to the verifiers 14. The controller 12 may also be connected with a source 13 via a network 15 that provides design, specification or property information of a system (or program) under verification. Although the controller 12 is connected to the source 13 via the network 15 in FIG. 1, the system 10 is not limited to obtaining information of the system under verification from any particular source. For example, a user may enter design information of hardware/software under verification using input units 18 of the verifiers 14.

The verifiers 14a and 14b include a display unit 16a and a display unit 16b, respectively. The display units 16a and 16b provide information of hardware/software under verification including but not limited to data of a set of states, an initial or a current state, verification result(s) indicating whether requirement(s) or target specification have been met, or any other data related to verification and/or reachability analysis pertaining to the hardware/software under verification.

The verifiers 14a and 14b may include corresponding input units 18a and 18b enabling entry of a variable, parameter, function or property of hardware or software under verification. Alternatively, property of the subject under verification may be obtained from the source 13 via the controller 12. Further, the system 10 may also include a hardware description language, such as Verilog that provides design information of the system under verification, an open source tool that translates design information of a system into functions, etc.

FIG. 1 illustrates verifier 14a with configuration 20a having multiple processors and memories, while verifier 14b is illustrated as having configuration 20b with a processor and a memory. However, the present invention is not limited to any particular architecture. For example, the system 10 may include a symmetric multiprocessing (SMP) architecture having two or more processors connected to a memory, a grid configuration with a series of processors with multiple memories, etc. Further, parallel processes related to verification may be executed using a multi-core processor implementing multiple threads. As also denoted in FIG. 1, the system 10 may include additional verifier(s) for performing verification. Operations of the verifiers 14 are explained in further detail below with respect to FIGS. 2, 3A and 3B.

As shown in FIG. 1, the system 10 may include a database 19 storing verification related information. Information stored in the database 19 may include binary decision diagrams (BDD) containing disjunctive transition relation decomposition representations of a system under verification as disclosed in U.S. application Ser. No. 11/875,364, filed on Oct. 19, 2007, titled DISJUNCTIVE PARTITIONING OF TRANSITION RELATION BASED VERIFICATION, inventor Jawahar Jain, et al., reachable states of the system, target specification of the system, functions of the system, etc. Further, the database 19 may also store various types of techniques used during verification and/or algorithms such as transition functions, partition ordered BDDs, etc., including but not limited to IWLS '95, MLP, etc.

The system 10 may conduct reachability analysis pertaining to a system under verification by providing an initial state of the system to both the verifier 14a and verifier 14b, or by distributing one or more decomposition components of transition relation of the system among the verifier 14a or verifier 14b. The controller 12 builds decompositions of transition relation of a system under verification, for example, by constructing an auxiliary function that captures semantics of transition relation of the system while remaining manipulable. For example, the system 10 may decompose transition relation of a system under verification into components such as $TR_i$ disclosed in U.S. Patent Application titled DISJUNCTIVE TRANSITION RELATION DECOMPOSITION BASED VERIFICATION, inventor Jawahar Jain, et al., U.S. application Ser. No. 11/875,364, filed on Oct. 19, 2007, and each of the components may be provided to a processor of the verifiers 14 to conduct reachability analysis using multiple image computation approaches. Operations for conducting reachability analysis of a system under verification are explained in further detail below with respect to FIGS. 3A and 3B.

The core of reachability analysis is image computation operation which, presented with a set of states $S_i$, detects all states $S_{i+1}$ that are reachable from $S_i$ in the next clock cycle. Typically, a provided invariant property $P(\vec{s})$ is checked during a reachability analysis, where the invariant property "passes" if the total reachable states is $R(\vec{s}) \subset P(\vec{s})$, and fails otherwise. During reachability analysis, if there are unreachable states within the set of states obtained, there may be an error in the system under verification. Similarly, an error may also be determined to exist when negation of the set results in any of the reachable states. Another way to verify a system is to look at the actual image computations one at a time as properties to be verified could have time semantics. For example, if a value is true at clock cycle i, another value is true at clock cycle i+5. Although certain examples of reachability analysis are mentioned, the present invention is not limited to any particular technique for conducting reachability analysis and may also use languages to verify properties such as linear temporal logic (LTL), computational tree logic (CTL), etc.

A synchronous circuit, comprising k latches and r inputs is defined by the set $S_0$ of reset states and the transition function $\delta: \{0,1\}^k \times \{0,1\}^r \mapsto \{0,1\}^k$ that encapsulates the k next state functions $\delta_i: \{0,1\}^k \times \{0,1\}^m \mapsto \{0,1\}$ of its memory elements.

The transition relation $TR(\vec{v}; \vec{v}'; \vec{p})$ may be formed as a Boolean function, where $$TR(\vec{v};\vec{v}';\vec{p})=1 \mathit{iff} \delta(\vec{v};\vec{p})=\vec{v}'$$

and is computed as $$TR(\vec{v};\vec{v}';\vec{p}) = \bigwedge (v'_i \equiv \delta_i(\vec{v};\vec{p})) \qquad (1)$$

Functions $b_{T_i}(v'_i; \vec{v}; \vec{p})=\vec{v}'_i \oplus \delta_i(\vec{v};\vec{p})$ are the bit relations of the circuit.

Operating on the state set $S_i$, the image computation is $$S_{i+1}(\vec{v})=\exists \vec{p},\vec{v}''; TR(\vec{v}'';\vec{v};\vec{p}) \wedge S_i(v'') \qquad (2)$$

and the set of reachable states S is $$S(\vec{v}) = \bigvee_{i=0}^{\infty} S_i(\vec{v}) \qquad (3)$$

As implied from equation 1 discussed above, monolithic transition relations are likely to blow-up even for relatively small bit relations. The advantages of disjunctive transition relation decompositions is apparent if the transition relation $TR(\vec{v}; \vec{v}'; \vec{p})$ formed as a Boolean function is decomposed according to the following:

$$TR_1(\vec{v};\vec{v}';\vec{p})TR_2(\vec{v};\vec{v}';\vec{p})TR_3(\vec{v};\vec{v}';\vec{p})$$

and the image may be computed as follows:

$$S_{i+1}(\vec{v}') = \exists \vec{p}, \vec{v}.\left(TR_1(\vec{v};\vec{v}';\vec{p}) \bigwedge S_i(\vec{v})\right) \bigvee$$
$$\exists \vec{p}, \vec{v}.\left(TR_2(\vec{v};\vec{v}';\vec{p}) \bigwedge S_1(\vec{v})\right) \bigvee$$
$$\exists \vec{p}, \vec{v}.\left(TR_3(\vec{v};\vec{v}';\vec{p}) \bigwedge S_1(\vec{v})\right)$$

Image computation of each of the components of the transition relation can then be computed independently since existential quantifications distribute over the disjunctions. Further, it is not necessary to quantify input variables $\vec{p}$ at each image computation because such computation may be performed after the decomposition has been obtained. Specifically, pre-computation may be implemented in accordance with the following:

$$TR'_i(\vec{v};\vec{v}')=\exists p \cdot TR_i(\vec{v};\vec{v}';\vec{p})$$

where the image computation is represented as follows:

$$S_{i+1}(\vec{v}') = \exists \vec{v}\left(TR'_1(\vec{v};\vec{v}') \bigwedge S_i(\vec{v})\right) \bigvee$$
$$\exists \vec{v}\left(TR'_2(\vec{v};\vec{v}') \bigwedge S_1(\vec{v})\right) \bigvee$$
$$\exists \vec{v}\left(TR'_3(\vec{v};\vec{v}') \bigwedge S_1(\vec{v})\right)$$

Verification approaches run using the system 10 may be predetermined based on an algorithm, selectable by a user requesting to run verification, or user provided such as the algorithm discussed in U.S. application Ser. No. 11/875,364, titled DISJUNCTIVE TRANSITION RELATION DECOMPOSITION BASED VERIFICATION, etc. However, the present invention is not limited to running any particular verification approach and may be implemented using any algorithm capable of generating states, at the level of an image computation.

The disclosed system 10 may perform multiple image computations which may in turn be used to generate other states, perform a given number of image computations, and synchronize multiple approaches running in parallel at a specified time interval, or at the image computation level. Implementation of various types of scheduling of image computations is explained in further detail below with respect to FIG. 4.

Figure 2:
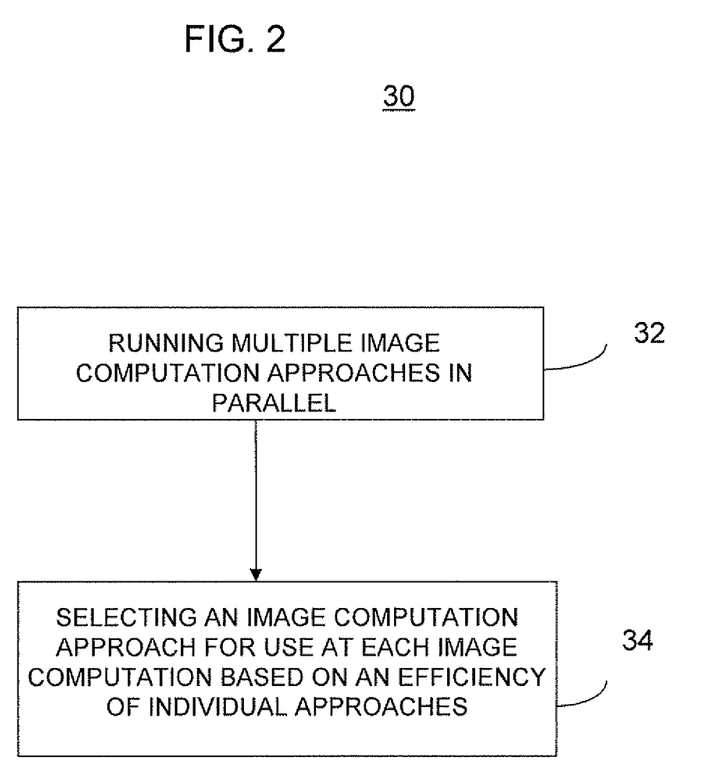
FIG. 2 is a flowchart for selecting an image computation approach.

An exemplary process 30 for an organic verification approach is illustrated in FIG. 2. As shown in FIG. 2, process 30 begins by running 32 multiple image computation approaches in parallel 32. Various approaches for obtaining all states reachable from an initial state (or current state) such as clustering, ordering, parallelization, and transition relation techniques, transition functions, partitioned BDD, IWLS, MLP, etc., may be run concurrently. Each reachability approach may be assigned to one of the processors of the verifiers 14 (FIG. 1), enabling a dedicated processor to run each reachability approach. Alternatively, processes of the image computation approaches may be distributed across processors of the configuration 20a and/or configuration 20b of the verifiers.

After running 32, process 30 continues by selecting 34 one of the image computation approach for use at each image computation based on an efficiency of individual approaches. An approach may be selected 34 based on a time of completion of the reachability analysis using the approach in comparison with reachability analysis performed using other approaches running in parallel. For example, an approach which completes image computation in relation to states of a system under verification prior to any of the other approaches running in parallel may be selected by the system 10 (FIG. 1). The system 10 may select one of the approaches at various stages of processes related to the verification and a result obtained using the selected approach may be used to obtain states at a subsequent stage of the verification using another approach. For example, an approach may be selected while image computation is being performed using states of a system under verification and a result of the image computation may be provided to other approaches running in parallel to perform a subsequent image computation.

Figure 3A:
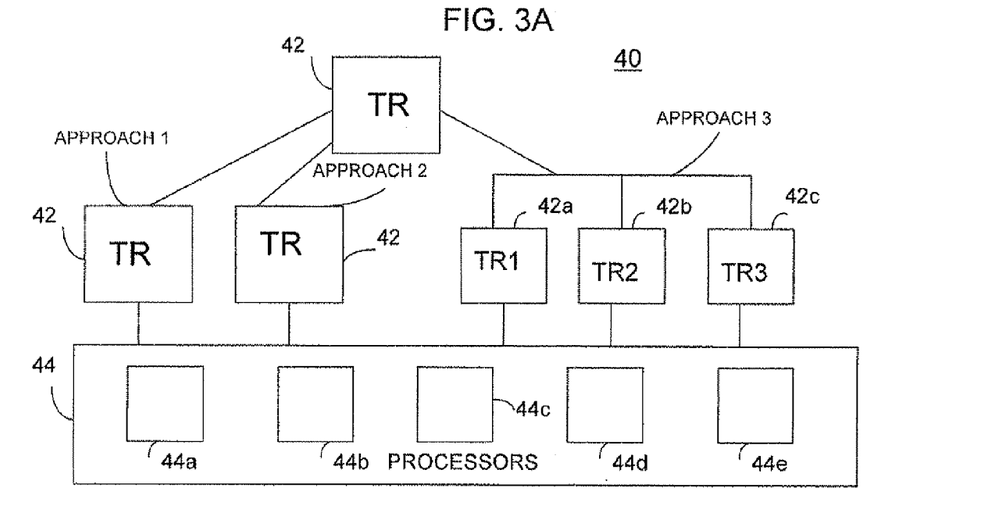
FIGS. 3A and 3B are diagrams illustrating execution of multiple image computation approaches.

FIG. 3A illustrates operation 40 for executing multiple image computation approaches. Transition relation (TR) 42 of a system under verification may be formed as a Boolean function and provided to approaches 1 through 3 for finding states reachable from an initial state and checking whether a property of a system to be verified is satisfied in the reachable states. As shown in FIG. 3A, approaches 1 and 2 obtain reachable states of the system under verification using TR 42. When approach 1 or 2 is determined to have optimally obtained reachable states in comparison to approach 3 running in parallel, the reachable states obtained may be used to verify a property of the system with respect to a target specification of the system. Alternatively, when approach 3 is determined to be optimal in comparison to approaches 1 or 2, reachable states obtained using approach 3 are utilized to verify the property of the system with respect to the target specification of the system. Approaches 1 and 2 may be IWLS, MLP, or any other existing approach that may be used to perform image computation for verification of hardware or software under verification.

Approach 3 builds decompositions TR1, TR2 and TR3 of the TR 42 and converts the decompositions to disjunctive transition relation representation as disclosed in U.S. application Ser. No. 11/875,364, titled DISJUNCTIVE TRANSITION RELATION DECOMPOSITION BASED VERIFICATION. In a preferred embodiment, a size of the decompositions TR1, TR2 and TR3 is determined based on achieving a balance between each of the decomposition components such that optimal image computation can be implemented across each of the decomposition components. For example, a function may be constructed to represent the TR1, TR2 and TR3 decomposition components having relatively equivalent number of nodes. In addition, a decomposition component is not limited to representing a set of states exclusive of states represented by another decomposition component(s), instead sets represented by the components may result in an overlap.

Operation 40 determines which of the approaches 1 through 3 provide an optimal solution for conducting reachability analysis, for example, based on a time of completion of the analysis and uses the selected approach to verify properties of the system under verification.

As illustrated in FIG. 3A, configuration 44 of processors may be provided to obtain reachable states of the system under verification using any one of approaches 1 through 3.

For example, TR1 may be provided to processor 44b to obtain reachable states of the system under verification, while TR2 is provided to processor 44a. The TR 42 of approach 1 and 2 may also be provided to any of the processors of the configuration 44. Operation 40 provides the TR 42 of the system under verification to approaches 1 through 3, approach 3 handles the TR differently by decomposing the TR into components (TR1, TR2, TR3), and approaches 1 and 2 maintain the monolithic transition relation (TR). For example, approaches 1 and 2 may be approaches such as MLP/IWLS which keep conjoined components of transition relation of a system under verification.

Figure 3B:
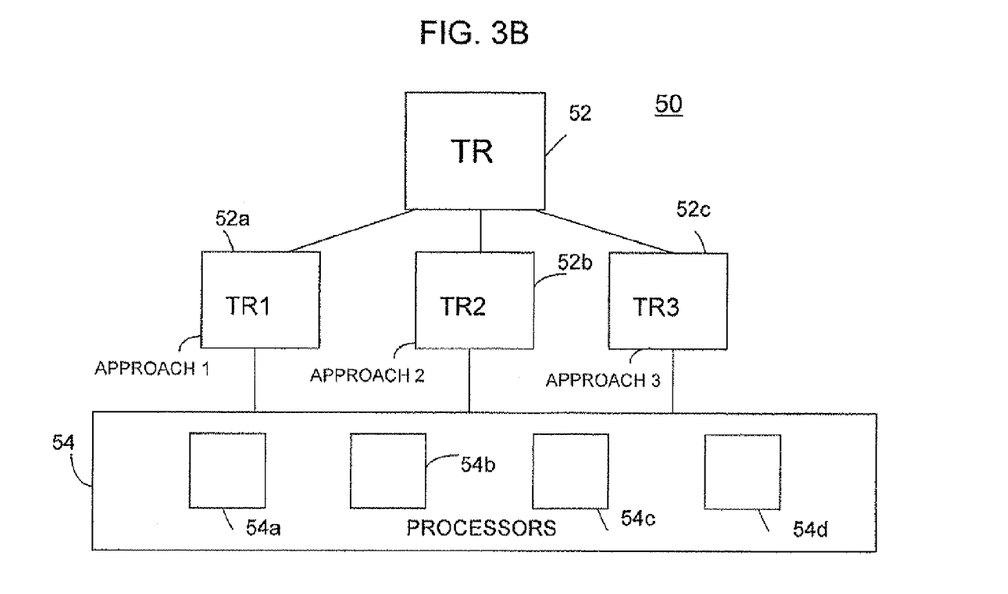

FIG. 3B illustrates operation 50 of applying multiple approaches to decompositions of transition relation of a system under verification. As shown in FIG. 3B, the TR 52 is decomposed into multiple disjunctive components 52a, 52b and 52c and the components 52a, 52b and 52c are forwarded to approaches 1 through 3 and/or processors 54. For example, reachability analysis of TR1 may be performed using the IWLS approach using processor 54a, while TR2 is provided to the MLB approach to perform reachability analysis using processor 54c.

When a result of the image computation approaches running in parallel indicates that approach 1 is the most efficient, process of approaches 2 and 3 may be terminated and the result from approach 1 is used to verify properties of the system under verification. When additional image computation needs to be performed subsequent to determination that the result obtained using approach 1 is the most efficient, the result is provided to approaches 2 and 3 such that approaches 1 through 3 perform subsequent image computations using the result obtained using approach 1.

In addition, the approaches 1 through 3 may be configured to implement reachability analysis using one or more of the processors 54. For example, if processor 54a finished performing reachability of a system under verification prior to any one of the processors in configuration 54 running in parallel, a result produced from processor 54a is provided to processors 54b through 54d for conducting subsequent reachability analysis. This enables efficient reachability analysis, especially for large circuits that may require performing a large number of image computations. Even assuming resources for synchronizing the multiple approaches running in parallel, penalty for such communication is fixed. In a preferred embodiment, synchronization is implemented during image computation to optimally use computing resource.

Essentially, operations 40 and 50 provide intermediate point(s) corresponding to image computations during which a determination is made to identify an optimal solution for conducting reachability analysis pertaining to a system under verification. For example, after obtaining reachable states using approach 3, processes of approaches 1 and 2 are terminated, and subsequent reachable states are obtained using the reachable states provided by approach 3. At each intermediate point, the controller 12 (FIG. 1) may once again decide which approach to run to obtain subsequent reachable states.

As shown in FIG. 3A, approaches 1 and 2 perform reachability analysis using the TR 42 and respectively provide a state using a particular reachability approach, while the disjunctive components 52a, 52b and 52c may be applied to the approaches 1 through 3 as shown in FIG. 3A. Operations 40 and 50 take a particular set of states of a system under verification and apply image computation using the TR to generate a new set of states. For example, reachable states of a system obtained by manipulating TR1 using an approach determined optimal among other parallel running approaches may be forwarded to the other parallel running approaches to generate a new set of states. As such, operations 40 and 50 enable determination of an optimal verification solution at different stages of verification.

Operations 40 and 50 provide different levels of parallelization where disjunctive components of transition relation of a system under verification are each used to obtain reachable states using multiple image computation approaches and the transition relation and the disjunctive components thereof are used to obtain the reachable states using the multiple image computation approaches. While it is possible that ignoring results of the decomposition components may result in partial verification of a state set, it is possible that states generated from a decomposition component may overlap with another component and provide formal verification. Further, if reachability approaches continue to run, it is possible that the verification may be formal due to overlapped components.

In addition, in cases where existing approaches have not been successful in obtaining reachable states, building components of the transition relation may provide an opportunity to process a part of the transition relation for which verification approaches may be utilized to obtain reachable states.

Figure 4:
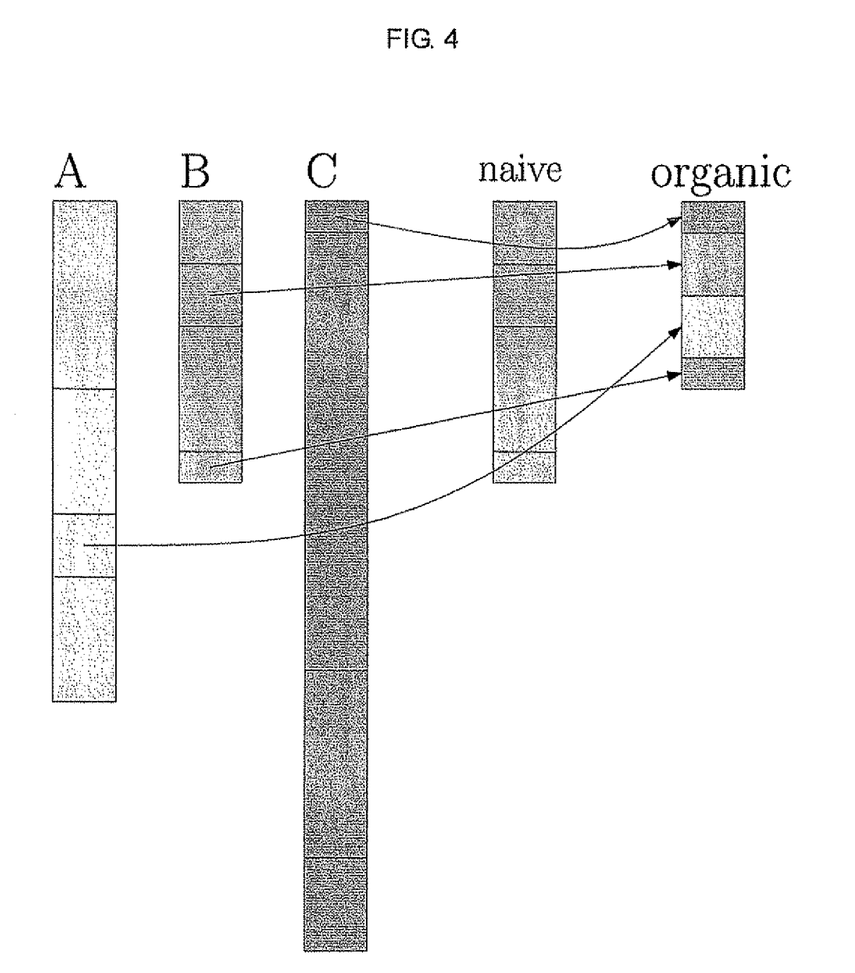
FIG. 4 is a diagram illustrating configuration of an organic verification approach.

FIG. 4 illustrates configuration of an organic verification approach. As shown in FIG. 4, an organic approach for verification is provided by combining verification techniques A, B and C and switching from one technique to another at a "microscopic" level. From a given image computation, the organic verification approach runs reachability analysis using techniques A through C in parallel, cancels each remaining pending reachability analysis upon completion of analysis using one of the techniques, and forwards the computation to all the other techniques until a fixed point is reached. As such, the organic verification approach enables tracing from one image computation frontier to another, where each part could be using multiple methods.

Reachable states set using the organic approach may be obtained by iteratively performing image computations using the TR and/or disjunctive components of the TR until a fixed or predetermined point is reached. A point at which obtaining the reachable states is terminated, for example, may be a point at which a given number of state sets has been obtained based on an approximated number of states provided by a designer of the system. The predetermined point may also be determined by selectively applying existential quantification utilizing the disjunctive TR components for providing semiformal verification results. Although a few examples are provided for determining a point at which obtaining the reachable states is terminated, the present invention is not limited to any particular determination and various factors including verifier and/or designer needs may be taken into consideration. For example, intermediate points need not correspond to a point corresponding to completion of the image computation with respect to a component of a transition relation.

According to the disclosed verification system and method, given techniques A and B, a final runtime that the organic approach achieves is not just minimum of A or B but may be smaller than either. This is because the disclosed organic approach is able to try in parallel multiple techniques (A, B and/or C) during each image computation and is not fixed to use of a single approach.

While an order in which the components are chosen is not crucial for the correctness of the analysis, the impact of performing image computation with each of the components on performance is significant. An order of the components for image computation schedules may be specified for purposes of optimizing completion times. The system 10 (FIG. 1) may implement various types of scheduling pertaining to image computations of the decomposition components including but not limited to a sequential schedule, a threaded schedule, synchronized threaded schedule, etc.

The organic verification approach may implement sequential scheduling where each of TR disjunctive components is configured to perform sequential image computation. For example, image computation may be performed sequentially using the TR components 42a, 42b, 42c shown in FIG. 3A. Alternatively, a threaded scheduling may be implemented where each thread of the processors in configuration 44 may be configured to apply one of the approaches 1 through 3 and wait until all threads are complete before the next image computation. While the threaded schedule obtains results in parallel all the time, which ever thread completes will pass the results back to the system 10 (FIG. 1) such that when another thread starts, it gets a current state of results. Further, the organic verification disclosed may also implement synchronized scheduling where image computations are applied using TR1 on the current state set, and the algorithm iterates only after all such computations are completed and results are collected into a state set.

As such, the disclosed organic verification approach augments efficacy of existing verification techniques by determining an optimal approach from among multiples approaches running in parallel, and enables switching from one approach to another approach during image computation.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A method, comprising:
running, via a computer, multiple image computation approaches in parallel;
selecting a single image computation while said multiple image computation approaches are running, said single image computation being determined to be most efficient among the multiple image computation approaches that are concurrently running at a given time; and
verifying a system property by analyzing reachable states with respect to a target specification, where the system property is verified using an organic approach obtained from a combination of each single image computation selected as being most efficient at a respective time during the running until the verifying is completed.

2. The method according to claim 1, wherein said selecting is performed at a fixed time interval.

3. The method according to claim 1, wherein said selecting is performed at each image computation.

4. The method according to claim 1, comprising:
obtaining reachable states of a system under verification using one of the image computation approaches selected; and
verifying properties of the system by analyzing said reachable states with respect to a target specification of the system.

5. The method according to claim 1, wherein said selecting includes terminating processes of said multiple image computation approaches with the exception of one of said image computation approaches selected.

6. The method according to claim 5, wherein said processes of the multiple image computation approaches are run at a subsequent image computation.

7. The method according to claim 1, wherein a single processor is used for running said multiple image computation approaches.

8. The method according to claim 1, wherein a processor is assigned to each of said multiple image computation approaches.

9. A method of verification, comprising:
selecting, via a computer, a single reachability approach determined to be an optimal reachability approach among reachability approaches that are running at a given time;
generating states of a circuit under verification using said optimal reachability approach; and
checking whether properties of the circuit are satisfied in said states by analyzing reachable states with respect to a target specification, where the properties are verified using an organic approach obtained from a combination of each single image computation selected as being most efficient at a respective time during the running until the checking is completed.

10. The method according to claim 9, comprising:
performing image computation in accordance with said selecting.

11. The method according to claim 9, wherein said running of the reachability approaches is repeated until a predetermined point is reached.

12. The method according to claim 9, wherein one of the reachability approaches includes:
building decompositions of transition relation of the circuit;
converting the decompositions to disjunctive transition relation representation; and
manipulating the transition relation representation and obtaining reachable states of the circuit.

13. The method according to claim 12, wherein only an optimal approach is performed until a predetermined point is reached.

14. The method according to claim 12, wherein computation is performed by processors sequentially, concurrently, and each processor synchronizes at a fixed time interval.

15. The method according to claim 14, wherein a size of each of the decompositions is below a predetermined threshold.

16. The method according to claim 15, wherein one of the reachability approaches is utilized with respect to a component of the decompositions of the disjunctive transition relation representation.

17. The method according to claim 9, wherein an approach is selected at different stages of the verification based on a time of completion of reachability analysis at said different stages.

18. A computer readable storage for controlling a computer having a data structure including reachable states of a system under verification, disjunctive transition relation decomposition representation of the system, and target specification of the system, comprising:
running multiple image computation approaches in parallel;
selecting a single image computation determined to be an efficient reachability approach among multiple reachability approaches that are concurrently running at a given time; and
verifying a property of the system by analyzing reachable states with respect to the target specification, where the property of the system is verified using an organic approach obtained from a combination of each single image computation selected as being most efficient at a respective time during the running until the verifying is completed.

19. A non-transitory computer readable medium having a program stored therein to cause a computer to execute operations, comprising:
running, via the computer, multiple reachability approaches in parallel;
selecting, a single reachability approach while said reachability approaches are running, said single reachability approach being determined to be most efficient among the multiple reachability approaches that are concurrently running at a given time; and
verifying a system property by analyzing reachable states with respect to a target specification, where the system property is verified using an organic approach obtained from a combination of each single image computation selected as being most efficient at a respective time during the running until the verifying is completed.

20. A system, comprising:
at least two processors running multiple reachability approaches in parallel;
a controller selecting, a single reachability approach while said running of multiple image computation approaches are running, one of said reachability approaches for use at each image computation selected being most efficient among individual approaches that are running at a given time; and
verifying a system property by analyzing reachable states with respect to a target specification, where the system property is verified using an organic approach obtained from a combination of each single image computation selected as being most efficient at a respective time during the running until the verifying is completed.

* * * * *